United States Patent [19]
Wong

[11] Patent Number: 6,144,241
[45] Date of Patent: Nov. 7, 2000

[54] VERSATILE GATE-ARRAY CELL WITH INTERSTITIAL TRANSISTORS FOR COMPACT FLIP-FLOPS WITH SET OR CLEAR

[75] Inventor: Anthony Yap Wong, Cupertino, Calif.

[73] Assignee: Pericom Semiconductor Corp., San Jose, Calif.

[21] Appl. No.: 09/315,776

[22] Filed: May 20, 1999

Related U.S. Application Data

[63] Continuation of application No. 08/887,351, Jul. 2, 1997.
[51] Int. Cl.[7] .................................................. H01L 27/10
[52] U.S. Cl. ........................... 327/202; 327/566; 326/41; 257/204
[58] Field of Search ..................................... 327/202, 203, 327/208–212, 218, 564, 565, 566; 326/40, 41, 44, 45; 257/202, 203, 204, 206

[56] References Cited

U.S. PATENT DOCUMENTS

| | | | |
|---|---|---|---|
| 6,031,982 | 2/2000 | Truong et al. | 395/500.17 |
| 6,057,568 | 5/2000 | Kumagai | 257/204 |
| 6,081,004 | 6/2000 | Wong et al. | 257/204 |

Primary Examiner—Tuan T. Lam
Attorney, Agent, or Firm—Stuart T. Auvinen

[57] ABSTRACT

A gate-array cell uses smaller and larger transistors. Four larger transistors are provided: two n-channel and two p-channel. A small p-channel transistor is placed between the contact tabs of the polysilicon lines of the two larger p-channel transistors, and between the p-channel transistors and a N-well tap. A small n-channel transistor is similarly placed between the contact tabs of polysilicon lines of the two larger n-channel transistors, and between the n-channel transistors and a P-well tap. The cell is slightly expanded in height to accommodate the two smaller transistors. The smaller transistors enable a reduction in the number of transistors required for latches and flip-flops. The smaller transistors allow a feedback inverter to directly connect to an input, since the input can easily over-power the feedback current. This is not possible for standard gate array cells having only one transistor size. Transmission gates are eliminated when direct feedback is feasible. Thus, the smaller transistors enable a reduction in transistor count as well as being smaller in size. Clear and set are provided by larger pull-down or pull-up transistors rather than NAND gates, since the larger pull-down and pull-up transistors can easily over-power the feedback inverters.

20 Claims, 10 Drawing Sheets

VERSATILE GATE-ARRAY CELL WITH INTERSTITIAL TRANSISTORS FOR COMPACT FLIP-FLOPS WITH SET OR CLEAR

RELATED APPLICATION

This Application is a continuation of Ser. No. 08/887,351 filed Jul. 2, 1997, hereby incorporated by reference.

BACKGROUND OF THE INVENTION

1. Field of the Invention

This invention relates to semiconductor logic arrays, and more particularly to gate-array cell layouts for flip-flops with set and clear.

2. Description of the Related Art

Higher densities of integration of semiconductor circuits have yielded a dramatic reduction in electronic component cost. Semi-custom chips reduce the initial tooling costs for new circuits (the non-recurring engineering or NRE costs). Semi-custom chips reduce tooling costs by customizing relatively few masking layers while using standard layouts for other masking layers. For example, gate-array semi-custom chips have an array of transistors formed in a standard layout in the base masking layers, such as the active-area, implant, polysilicon layers. Upper masking layers, such as contacts, metals, and vias are customized for each customer's circuit design.

While such gate-array chips are effective at reducing costs, often the transistors are arrayed less compactly than custom circuits. The larger area required increases production costs for a gate-array implementation of a circuit compared to a custom implementation of the circuit. A more efficient, compact gate-array cell is thus desirable.

STANDARD CMOS FLIP-FLOP CIRCUIT

Circuits implemented on gate array chips often use many flip-flop circuits. These flip-flop circuits are mapped to several gate-array cells; typically 6 to 8 cells are used for each flip-flop implemented.

FIG. 1 shows a prior-art flip-flop circuit. Most gate-array chips use a complementary metal-oxide-semiconductor (CMOS) process, using complementary p-channel and n-channel transistors in most gates. Flip-flop 10 is a D-type flip-flop with asynchronous clear. The D data input is buffered by inverter 12 and sampled by transmission gate 30 when clock CK is low. Clock CK is locally buffered by inverters 26, 28. The sampled D input is inverted in the master stage by inverter 14 and then clocked into the slave stage by transmission gate 36 when clock CK is high. Once clocked into the slave stage, the Q output is generated after passing through NAND gate 18 and output inverter 22.

Feedback in the slave stage is provided by inverter 24, which forms a holding latch when transmission gate 34 is on when clock CK is low. Feedback in the master stage is provided by NAND gate 16 and transmission gate 32, which is on when clock CK is high. In the master stage, either transmission gate 32 or transmission gate 30 is open. In the slave stage, either transmission gate 34 or transmission gate 36 is open.

Transmission gates 30, 32, 34, 36 each have both an n-channel and a p-channel transistor to avoid voltage drops through the transmission gates. Both the master and the slave stage are cleared when clear CD is pulsed low. NAND gates 16, 18 each output a high when clear CD is low. A set rather than a clear function is provided when the positions of inverter 14 and NAND gate 16 are swapped, and the positions of inverter 24 and NAND gate 18 also are swapped.

Regardless of which transmission gates are open, both the master and slave are cleared and the Q output becomes low. Such an asynchronous clear is robust, allowing the clock CK to be in any state during clear. However, such robustness is not always needed. Sometimes some of the transmission gates are deleted, as disclosed by Mahant-Shetti et al. in, U.S. Pat. No. 5,612,632, assigned to Texas Instruments.

DISADVANTAGES OF STANDARD FLIP-FLOP

Flip-flop 10 requires 28 transistors. Interconnection or wiring of the transistors in a gate-array cell is complicated by the full transmission gates, since the p-channel and n-channel transistors are formed in remote portions of each gate-array cell. Metal cross-overs are needed to connect the input and outputs of each transmission gate. Often additional gate-array cells are used to make room for the transmission gates' interconnect, even through the transistors in the additional cells' are not needed. Thus space is wasted. Delays such as the clock-to-output delay are also increased by using NAND gates for the clear function. NAND gates are slower than inverters since the n-channel transistors in the NAND gate are connected in series.

STANDARD FLIP-FLOP WITH SET AND CLEAR

Often both a set and a clear function are needed in a flip-flop. FIG. 2 shows a prior-art flip-flop with both set and clear. The gates function as described for FIG. 1, except that NAND gates 38, 44 replace inverters 14, 24. NAND gates 38, 44 force both the master and the slave stage to logical one when set SD is low. Output Q of flip-flop 20 is also forced high.

Flip-flop 20 with both set and clear requires 32 transistors, four more than flip-flop 10 with just clear. Both the set and clear are fully asynchronous with respect to clock CK. Many modern circuits are so complex that fully synchronous design methods are used anyway. Thus the set or clear signals are usually synchronous to the clock. The robustness of flip-flops 10, 20 is thus not needed for these modern, fully-synchronous designs.

GATE-ARRAY CELL LAYOUT

FIG. 3 is a diagram of the physical layout of a prior-art gate-array cell. Cell 50 is a basic cell with 4 transistors, capable of implementing a 2-input NAND or NOR gate, or 2 inverters. Such cells can be combined together to form more complex gates such as AND-OR-INVERT gates, XOR gates, latches, or flip-flops.

The p-channel transistors are formed where polysilicon 56 crosses over p-channel active area 52. Active areas are regions on the silicon surface without a thick insulating field oxide. A thin gate oxide is formed underneath polysilicon 56, and a high concentration of p-type dopant is implanted into p-channel active area 52 to form P+ sources and drains. Polysilicon 56 acts as a self-aligned mask during implant to form P+ sources and drains next to the un-implanted gate area under polysilicon 56.

N-channel transistors are formed where polysilicon 58 crosses over n-channel active area 54. Since n-channel and p-channel transistors are formed in separate substrates or wells, a relatively large spacing is required between n-channel active area 54 and p-channel active area 52. Well tap 64 is formed by implanting N+ dopant into an active area in the well for p-channel transistors, while well tap 62 is formed by implanting P+ dopant into the well for n-channel transistors. Thus well taps 62, 64 are formed when the opposite type dopant is implanted.

Gate-array cell 50 is customized by forming contacts (not shown) to sources and drain areas in active areas 52, 54, and to the tabs at the ends of polysilicon 56, 58 over the non-active field-oxide areas. The contacts are made up to a first layer of metal, which is customized primarily for local interconnection within cells. Contacts are also made from a ground metal line to well tap 62 and from power-supply metal line to well tap 64 to provide a back bias to transistors. Additional vias from first metal to second and possible third or fourth layers of metal can also be customized, as can the interconnection on these upper metal layers.

A gate-array cell with the well taps on the tops and bottoms of cells is disclosed by Yin in U.S. Pat. No. 5,384,472, assigned to Aspec Technology. This arrangement is more efficient than having well taps on the sides of the cells, as taught by Hui et al., U.S. Pat. No. 4,884,118, assigned to LSI Logic.

NOT ALL CELL TRANSISTORS SHOULD BE THE SAME SIZE

Often it is desirable for some of the transistors to have different sizes than the single gate-width provided in FIG. 3. More versatile gate-array cells are taught by Hashimoto et al. in U.S. Pat. No. 5,563,430, assigned to Texas Instruments. However, Hashimoto's cell is inefficient since the smaller-size gate is always connected to a larger-size gate in a single polysilicon line. Thus larger and smaller gates are always formed together, and the smaller gate suffers additional delay from the loading of the larger gate even when the larger gate is not used.

Separate, half-sized transistors in the middle of an array of n-channel transistors are disclosed in U.S. Pat. No. 5,452,245 by Hickman et al., assigned to Motorola. While this arrangement is useful for memory cells needing smaller pass transistors, it has limited application for logic gates. The cell placement is inefficient because of the non-homogeneous cell structure. The smaller transistors cannot be used for many logic circuits.

An efficient yet versatile gate-array cell is desired for implementing a wide variety of gates, latches, and flip-flops. What is desired is a versatile gate-array cell with transistors of two different sizes. It is desired to reduce the size of the gate-array cell by efficient placement of the smaller-sized transistors within the cell. It is desired to improve efficiency by reducing the number of transistors in a flip-flop cell. It is desired to use the smaller-size transistors in the versatile gate-array cell for feedback devices to eliminate half of the transmission gates in a flip-flop, thus reducing the number of transistors in a flip-flop implemented on gate-array cells.

SUMMARY OF THE INVENTION

A gate-array cell has large and small transistors. The gate-array cell has a large p-channel active area with a first large p-channel transistor and a second large p-channel transistor. The first large p-channel transistor is formed where a first polysilicon line crosses the large p-channel active area. The second large p-channel transistor is formed where a second polysilicon line crosses the large p-channel active area.

A small p-channel active area has a small p-channel transistor. An N-well tap provides a substrate bias to bulk terminals of the first and second large p-channel transistors and the small p-channel transistor.

A large n-channel active area has a first large n-channel transistor and a second large n-channel transistor. The first large n-channel transistor is formed where a third polysilicon line crosses the large n-channel active area, while the second large n-channel transistor is formed where a fourth polysilicon line crosses the large n-channel active area.

A small n-channel active area has a small n-channel transistor. A P-well tap provides a substrate bias to bulk terminals of the first and second large n-channel transistors and the small n-channel transistor. The small p-channel transistor has a maximum current drive of less than one-quarter of a maximum current drive of the first large p-channel transistor, while a maximum current drive of the first large p-channel transistor is substantially equivalent to maximum current drive of the second large p-channel transistor. The small n-channel transistor has a maximum current drive of less than one-quarter of a maximum current drive of the first large n-channel transistor. A maximum current drive of the first large n-channel transistor is substantially equivalent to maximum current drive of the second large n-channel transistor. Thus the gate-array cell contains four large and two small transistors.

In further aspects of the invention the gate-array cell is arrayed into multiple rows on a gate-array chip. Metal layers and contacts between the metal layers and the first, second, third, and fourth polysilicon lines and the large and small p-channel and n-channel active areas are customized for different customer designs.

In still further aspects the large p-channel transistor, the large n-channel transistor, the small p-channel transistor, and the small n-channel transistor have a same orientation wherein source and drain active areas are on right and left sides of each polysilicon gate of each transistor. Thus all transistors have the same orientation. The small p-channel transistor is between the N-well tap and the large p-channel active area, and the small n-channel transistor is between the P-well tap and the large n-channel active area.

In further aspects the small p-channel transistor is located midway between an upper end of the first large p-channel transistor, an upper end of the second large p-channel transistor, and the N-well tap. The small n-channel transistor is located midway between a lower end of the first large n-channel transistor, a lower end of the second large n-channel transistor, and the P-well tap. Thus the small p-channel and n-channel transistors are located between the large transistors and the well taps.

In other aspects the first polysilicon line and the third polysilicon line are connected together by polysilicon to form a merged polysilicon line, but the second polysilicon line is separate from the fourth polysilicon line. Thus the merged polysilicon line connects to both the first large p-channel transistor and the first large n-channel transistor, without requiring metal for local connection.

DETAILED DESCRIPTION

The present invention relates to an improvement in gate-array cell layout. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that size and cost reductions are possible by reducing the number of transistors in a basic flip-flop circuit. An additional size reduction is achieved by using smaller-size transistors in a gate-array cell with both large and small transistors sizes. The smaller transistors can be used for feedback inverters. When the smaller transistors are sufficiently small relative to the larger transistors in the cell, the feedback transmission gate can be eliminated since the smaller transistors can be over-powered by larger upstream transistors.

Figure 4:
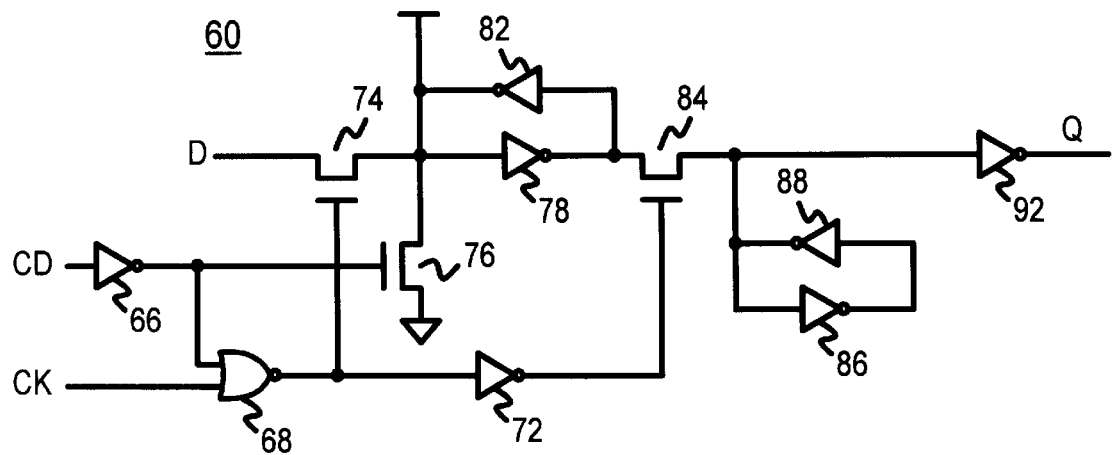
FIG. 4 is a schematic diagram of a flip-flop with clear having a reduced number of transistors.

FIG. 4 is a schematic diagram of a flip-flop with clear having a reduced number of transistors. Flip-flop 60 is a D-type flip-flop, which is cleared when clear CD is pulsed low.

The full transmission gates of the prior art are replaced with n-channel pass transistors 74, 84. A voltage drop through pass transistors 74, 84 occurs due to the body-bias effect, but noise margins are usually high enough in CMOS circuits that this voltage degradation does not cause failures. Feedback inverters 82, 88 pull the voltage back to Vdd.

FEEDBACK TRANSMISSION GATE ELIMINATED USING SMALLER TRANSISTORS IN FEEDBACK

The feedback transmission gates are eliminated. In prior-art gate arrays, all transistors are usually of the same size and thus most inverters in a flip-flop have about the same current drive. Eliminating the feedback transmission gates in the prior-art master or slave stage could cause a failure because the master's or slave's feedback inverters have about the same current drive as the current driven into the slave stage from the D-input or master stage.

The invention uses smaller transistors for feedback inverters 82, 88. The smaller transistor size reduces the current driven from feedback inverters 82, 88. The maximum current from the smaller transistors is less than one-quarter of the maximum current from the larger transistors. The current driven from master-stage inverter 78 through pass transistor 84 is sufficiently large to overpower the current from feedback inverter 88 and toggle the slave latch of inverters 86, 88. Thus using smaller transistors for the feedback inverters allows the slave stage to be over-written by the master. Likewise feedback inverter 82 in the master stage is constructed form smaller transistors so that the current driven into the master through pass transistor 74 can overpower the feedback current. Thus the master latch of inverters 78, 82 can be over-written despite their being no transmission gate to cut off the feedback current when writing the master latch.

CLEAR WITHOUT NAND GATES

The NAND gates for the clear function are replaced by simple pull-down transistors and clear control. When clear CD is low, pull-down n-channel transistor 76 is turned on by inverter 66, which inverts the active-low clear CD. Pull-down transistor 76 pulls the input of inverter 78 low, writing a low to the master latch. NOR gate 68 receives the inverted clear from inverter 66 and outputs a low inverted clock CK' during the clear pulse. The low inverted clock closes pass transistor 74, allowing pull-down transistor 76 to clear the master latch. The low inverted clock is inverted again by inverter 72 and the high output opens pass transistor 84. The cleared master then writes the zero to the slave latch through open pass transistor 84. The output Q is driven low by inverter 92. Output loading does not affect the slave latch because inverters 86, 88 are buffered from the output by inverter 92.

Figure 1:
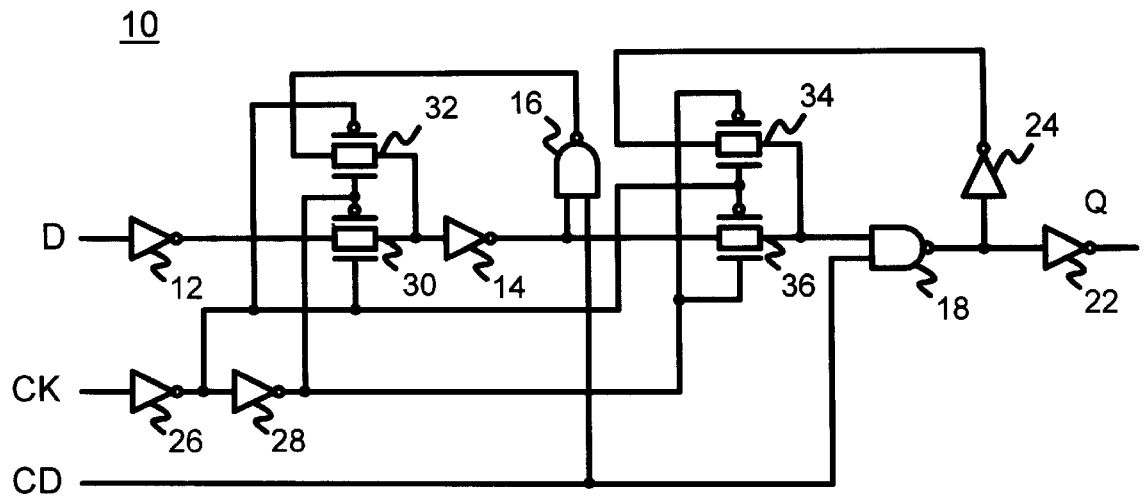
FIG. 1 shows a prior-art flip-flop circuit with clear.

Flip-flop 60 requires only 21 transistors compared to 28 transistors for the prior-art of FIG. 1. This is a reduction of 25% of the number of transistors. Area is further reduced by using smaller-size transistors for feedback inverters 82, 88. Interconnection wiring is simplified since wiring from p-channel transistors to n-channel transistors for transmission gates is not needed with the simple pass transistors. The clock-to-output delay is improved since slower NAND gates are replaced by inverters.

FLIP-FLOP WITH SET—FIG. 5

Figure 5:
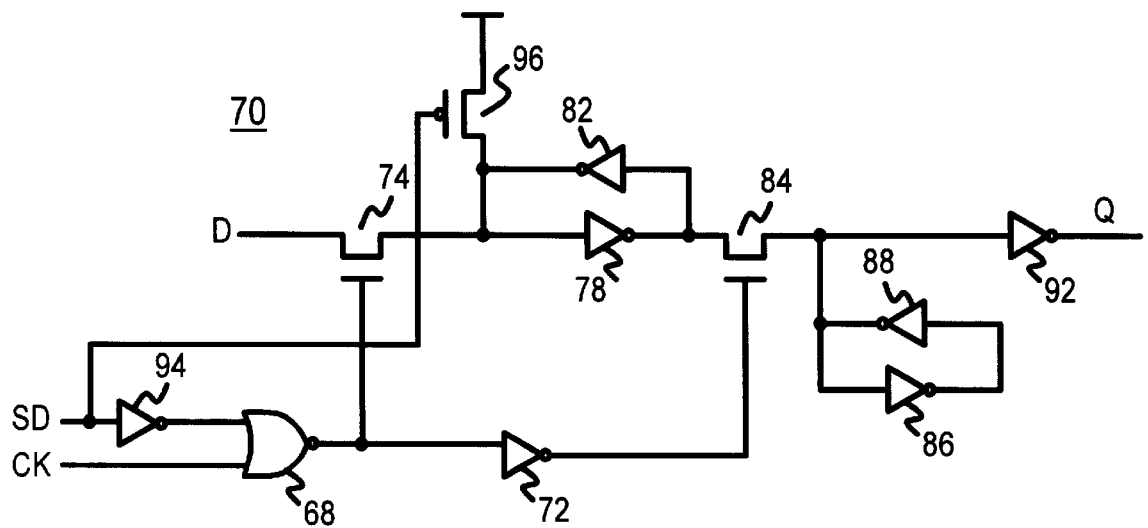
FIG. 5 is a schematic diagram of a flip-flop with a set function with a reduced number of transistors by using a gate array cell with small and large transistors.

FIG. 5 is a schematic diagram of a flip-flop with a set function with a reduced number of transistors by using a gate array cell with small and large transistors.

Settable flip-flop 70 is set to a logical one when set SD is pulsed low. The low set SD enables pull-up p-channel transistor 96, setting high the master latch of inverters 82, 78. The low set SD is inverted by inverter 94 and drives the output of NOR gate 68 low and the output of inverter 72 high. This closes master-stage pass transistor 74 but opens slave-stage pass transistor 84, allowing pull-up transistor 96 to write a one to the master latch, which is copied to the slave latch of inverters 86, 88.

FLIP-FLOP WITH SET AND CLEAR—FIG. 6

Figure 6:
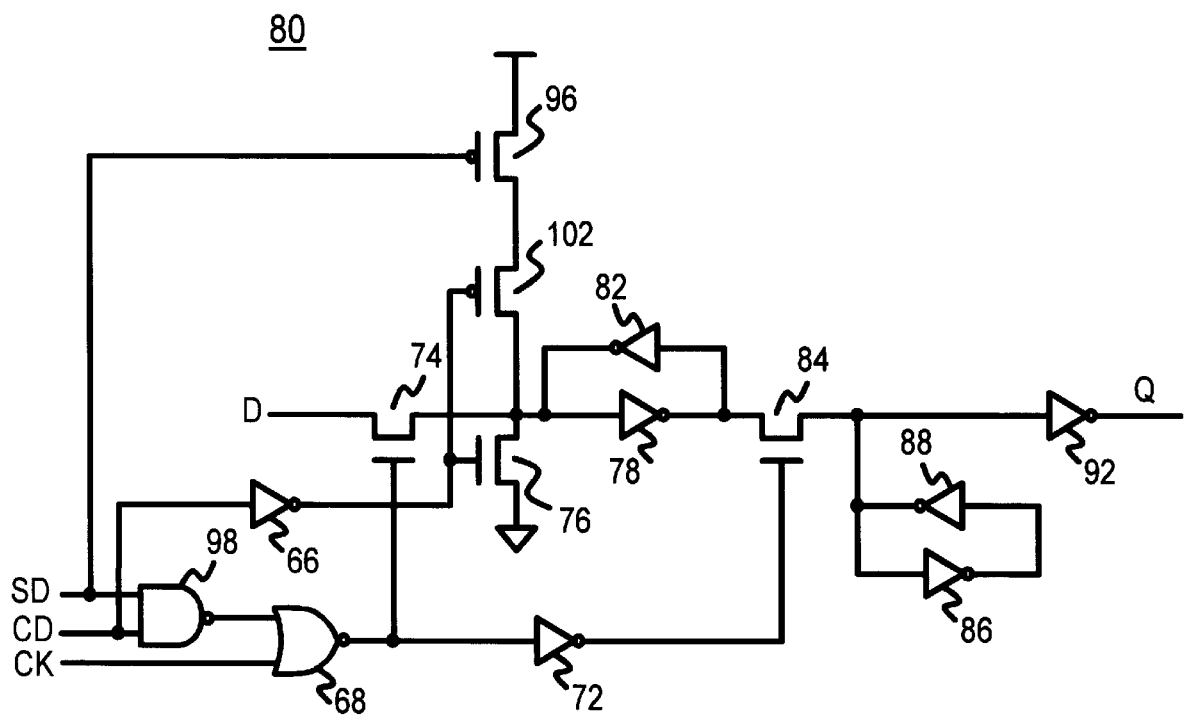
FIG. 6 is a schematic diagram of a flip-flop with set and clear functions with a reduced number of transistors by using a gate array cell with small and large transistors.

FIG. 6 is a schematic diagram of a flip-flop with set and clear functions with a reduced number of transistors by using a gate array cell with small and large transistors. Flip-flop 80 is set to a logical one when set SD is pulsed low, but cleared to logical zero when clear CD is pulsed low. The low set SD enables pull-up p-channel transistor 96, setting high the master latch of inverters 82, 78.

When either set or clear is pulsed low, NAND gate 98 outputs a high to NOR gate 68, which has its output forced low. The low output of NOR gate 68 is inverted by inverter 72, which drives a high to the gate of pass transistor 84. This closes master-stage pass transistor 74 but opens slave-stage pass transistor 84. Either pull-up transistor 96 can then write a one or pull-down transistor 76 can write a zero to the master latch, which is copied to the slave latch of inverters 86, 88. Isolating p-channel transistor 102 is turned off when clear CD is active low, preventing a set pulse from interfering with the clear. Thus clear has priority over set.

Figure 2:
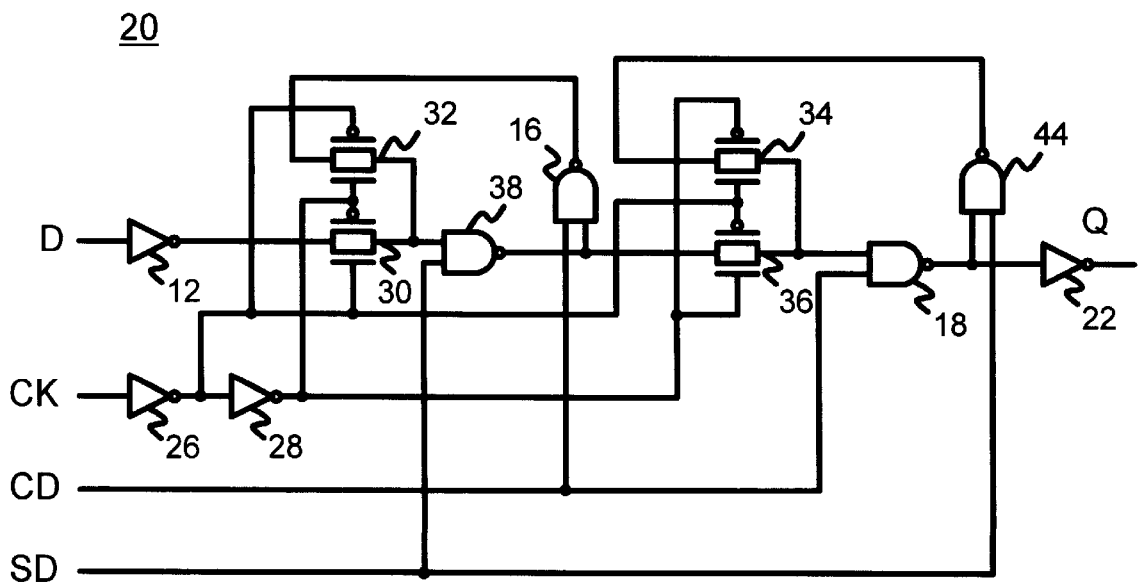
FIG. 2 shows a prior-art flip-flop with both set and clear.
Figure 3:
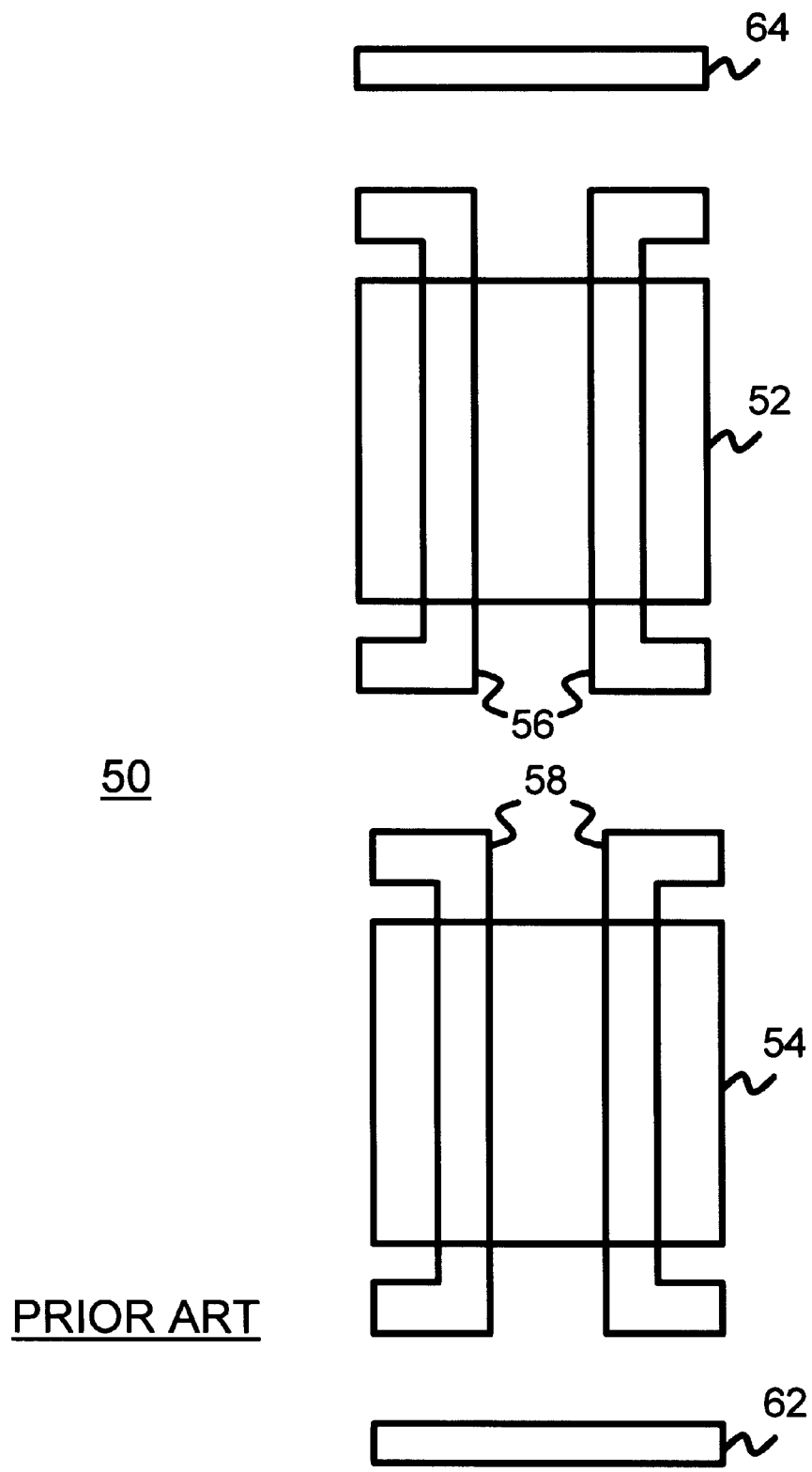
FIG. 3 is a diagram of the physical layout of a prior-art gate-array cell.

When it can be guaranteed that set and clear are never pulsed at the same time, isolating transistor 102 can be eliminated. The transistor count is then reduced to 26, compared with 32 transistor for flip-flop 20 of FIG. 2. A 17% reduction is achieved in the transistor count.

Thus various D-type flip-flops can be constructed with fewer transistors when smaller transistors for latch feedback are made available in the gate-array cells. Clear or set functions can be included in the flip-flop, or both set and clear can be included as needed by the customer's design.

LAYOUT OF GATE-ARRAY CELL WITH LARGER AND SMALLER TRANSISTORS

Figure 7:
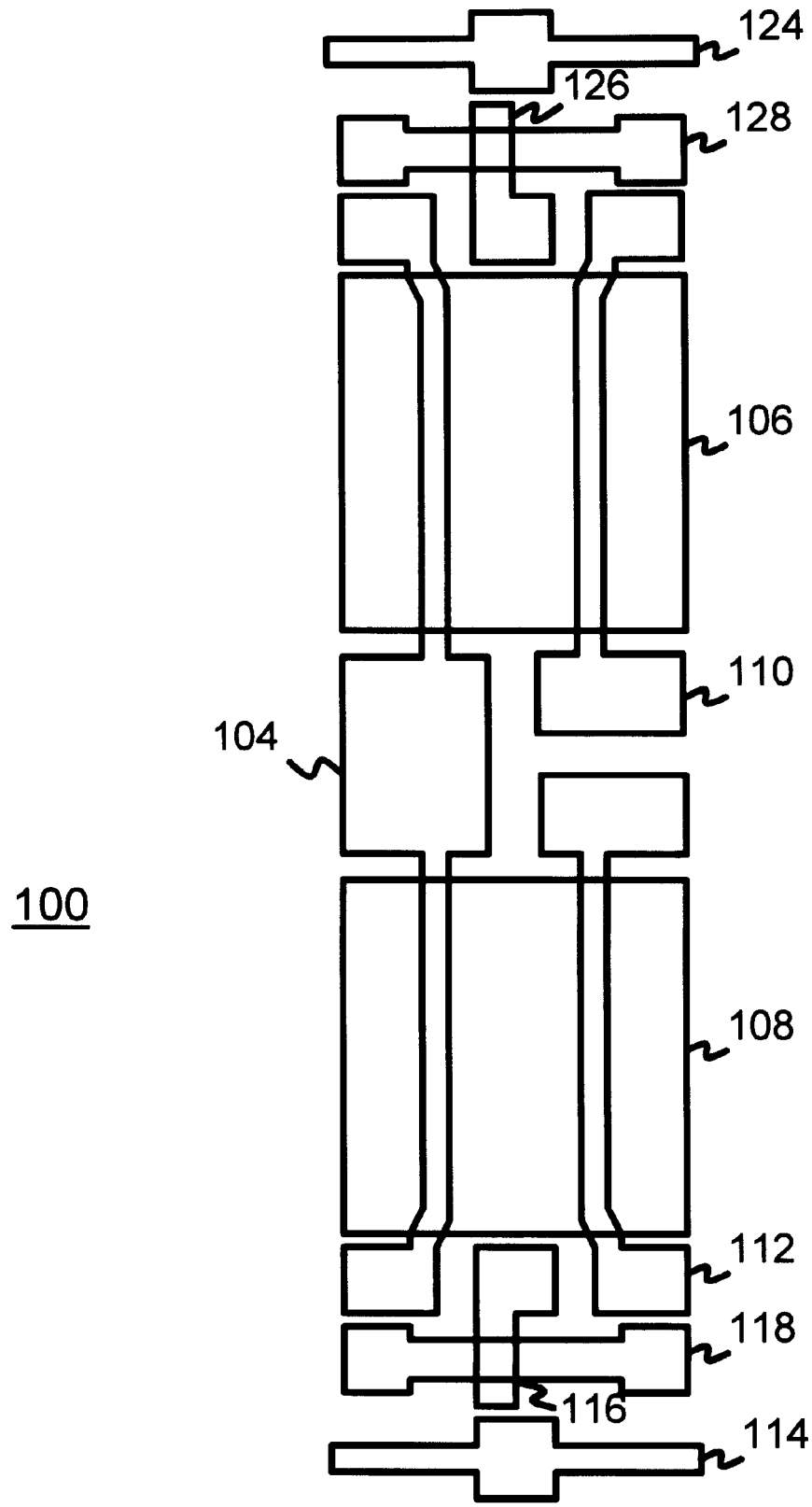
FIG. 7 is a layout diagram of a gate-array cell with smaller transistors located between larger transistors.

FIG. 7 is a layout diagram of a gate-array cell with smaller transistors located between larger transistors. The smaller transistors are formed in the interstitial area between the larger transistors so that the area of the cell is expanded only slightly, and only in height and not in width. The flip-flops of FIGS. 4, 5, and 6 are specifically designed to be constructed from copies of gate-array cell 100 of FIG. 7.

Large p-channel transistors are formed where polysilicon lines 104, 110 cross over p-type active area 106, while large n-channel transistors are formed where polysilicon lines 104, 112 cross over n-type active area 108. N+ well tap 124 is an n+-doped active area in the same N-well as p-type active area 106, and provides a back-bias to all p-channel transistors when N+ well tap 124 is connected to the power-supply metal bus by contacts (not shown). P+ well tap 114 is a p+-doped active area in the same P-well as n-type active area 108, and provides a back-bias to all n-channel transistors when P+ well tap 114 is connected to the ground-supply metal bus by contacts (not shown).

Smaller transistors are formed between well taps 114, 124 and active areas 106, 108 for the larger transistors. A smaller p-channel transistor is formed in the N-well where polysilicon line 126 crosses over small p-type active area 128. Likewise, a smaller n-channel transistor is formed in the P-well where polysilicon line 116 crosses over small n-type active area 118.

The upper ends of polysilicon lines 104, 110 are spread apart slightly to make room for polysilicon line 126 of the smaller p-channel transistor, while the lower ends of polysilicon lines 104, 112 are spread apart slightly to make room for polysilicon line 116 for the smaller n-channel transistor. Thus the width of the gate-array cell is not increases by any significant amount to incorporate the two smaller transistors. The height of the gate-array cell is increase by a relatively small amount to fit the additional active areas 118, 128 between the larger active areas 106, 108 and the well taps 124, 114. Thus the area of the gate-array cell is only marginally increased by the addition of the two smaller transistors. For some processes with small active-to-active spacing layout rules but larger spacing rules, the cell's height may not increase at all.

The source end of smaller active area 128 can be merged with well tap 124 without an intervening field oxide area. A contact in the source side of smaller active area 128 can straddle well tap 124, further reducing the area required for the smaller transistor. The same contact-sharing scheme can be used for the smaller n-channel transistor.

The smaller transistors are parallel, and above or below the larger transistors, being formed interstitially between each pair of polysilicon lines for the larger transistors. All transistors have their source/drain regions on the sides of the gate. Having all gates run in the same direction is a benefit for processing yields, since mask mis-alignments tend to affect all transistors in the same way, helping the transistor's electrical characteristics to track other transistors. This improves performance.

The size of the larger transistors is about ten times the size of the smaller transistors, although a ratio of 1:5 to 1:20 should operate properly. The channel length, L, of all transistors is the minimum polysilicon width for the process, currently 0.25 to 0.6 micron for advanced gate-array processes. The transistor width W is determined by the height of the active areas where the polysilicon lines crosses. The larger transistors typically have a W of 5 microns while the smaller transistors have a W of 0.5 micron. Sometimes the p-channel transistors have a larger W than the n-channel transistors to compensate for the lower hole mobility compared with the electron mobility. For example, the larger p-channel transistors could have a W of 10 microns while the larger n-channel transistors have a W of 5 microns. This gives the p-channel and n-channel transistors about the same current drive.

POLYSILICON LINES FOR SOME LARGER TRANSISTORS MERGED

Polysilicon line 104 crosses over both p-type active area 106 and n-type active area 108. Merging the polysilicon lines for both p-channel and n-channel transistors improves interconnection within the cell, since polysilicon line 104 can act as an interconnection line from the top to the bottom of the cell. Using polysilicon line 104 can eliminate a metal interconnect line otherwise needed for local interconnect.

Often both an n-channel and a p-channel transistor have their gates connected together, such as for inverters, NAND, and NOR gates. Merged polysilicon line 104 is ideal for such uses. However, other times separate gates are needed, for special circuits such as for memory cells. The other two larger transistors are constructed from separate polysilicon lines 110, 112, which are not merged together. Thus both a merged gate and separate gates are available in each gate-array cell. This flexibility makes the gate-array cell more versatile, able to efficiently implement many different kinds of logic elements.

EXAMPLES OF GATES IMPLEMENTED BY GATE-ARRAY CELLS WITH SMALLER AND LARGER TRANSISTORS

Many different logic gates and macro cells can be implemented with the gate-array cell having larger and smaller transistors. There are 3 n-channel and 3 p-channel transistors available, so up to 3 inverters can be constructed in one cell. Two of the 6 transistors are smaller-size transistors, which are ideal for a feedback inverter in a latch. Thus two full-size and one weak inverter can be constructed.

Figure 8A:
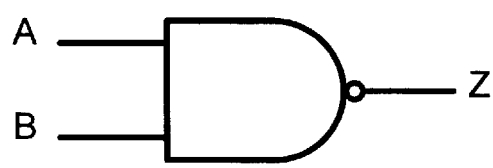
FIG. 8A is a 2-input NAND gate implemented in the gate-array cell shown in FIG. 8B.
Figure 8B:
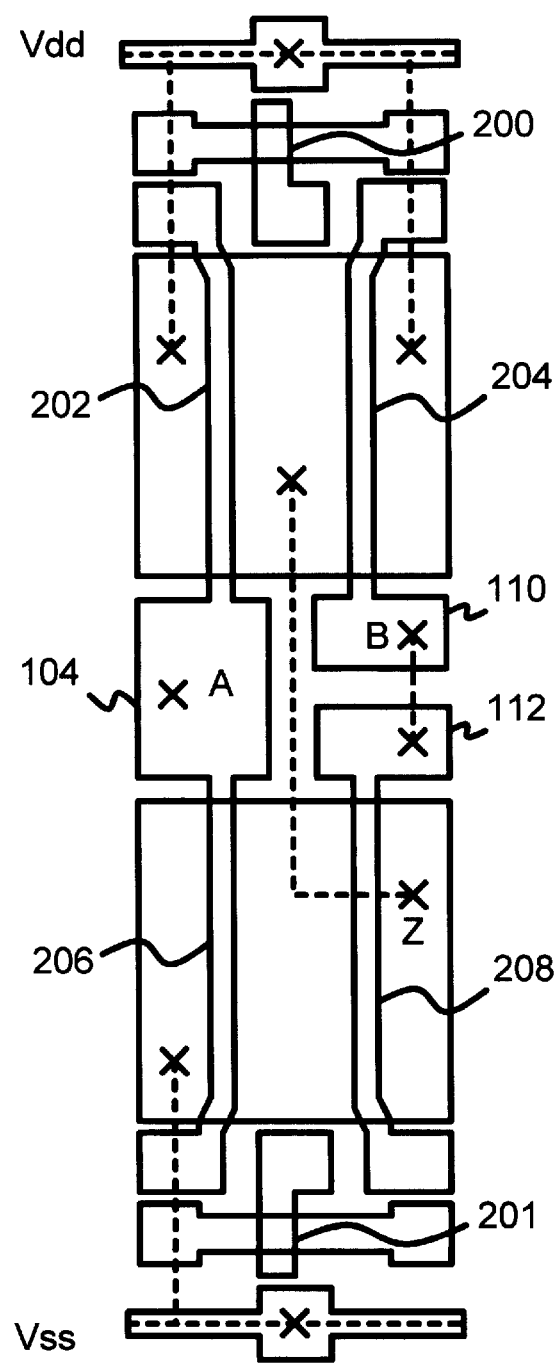

FIG. 8A is a 2-input NAND gate implemented in the gate-array cell shown in FIG. 8B. In these "stick diagrams" the "x" indicates a contact from first metal to either polysilicon or an active area, while dashed lines connecting the "x" 's represent metal lines. The A input of the NAND gate is connected to merged polysilicon line 104, which forms the gates of transistors 202, 206. The B input of the NAND gate is connected to polysilicon line 110, forming p-channel transistor 204, and to polysilicon line 112, forming n-channel transistor 208. Smaller transistors 200, 201 are not used. The output Z is taken from the middle of the p-channel active area, the drains of p-channel transistors 202, 204, while Z is also connected to the drain of n-channel transistor 208.

The power supply, Vdd, runs in a horizontal metal line across the well taps at the tops of the gate-array cells, while ground (Vss) runs in another horizontal metal line across the well taps at the bottoms of the gate-array cells. Vdd is connected to the sources of p-channel transistors 202, 204, while ground is connected to the source of n-channel transistor 206. The active area between n-channel transistors 206, 208 is not connected to metal since transistors 206, 208 are connected in series. A 2-input NOR gate can be constructed by connecting p-channel transistors 202, 204 in series and n-channel transistors 206, 208 in parallel.

Figure 9A:
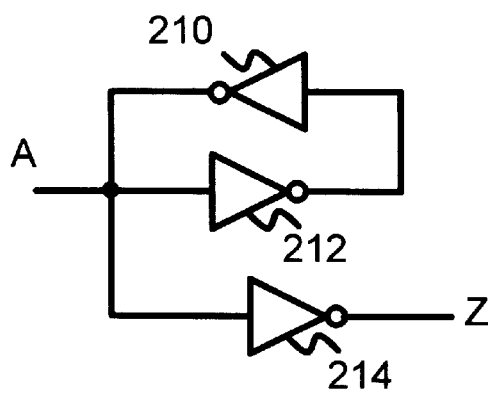
FIG. 9A is an inverting latch implemented in the gate-array cell shown in FIG. 9B.
Figure 9B:
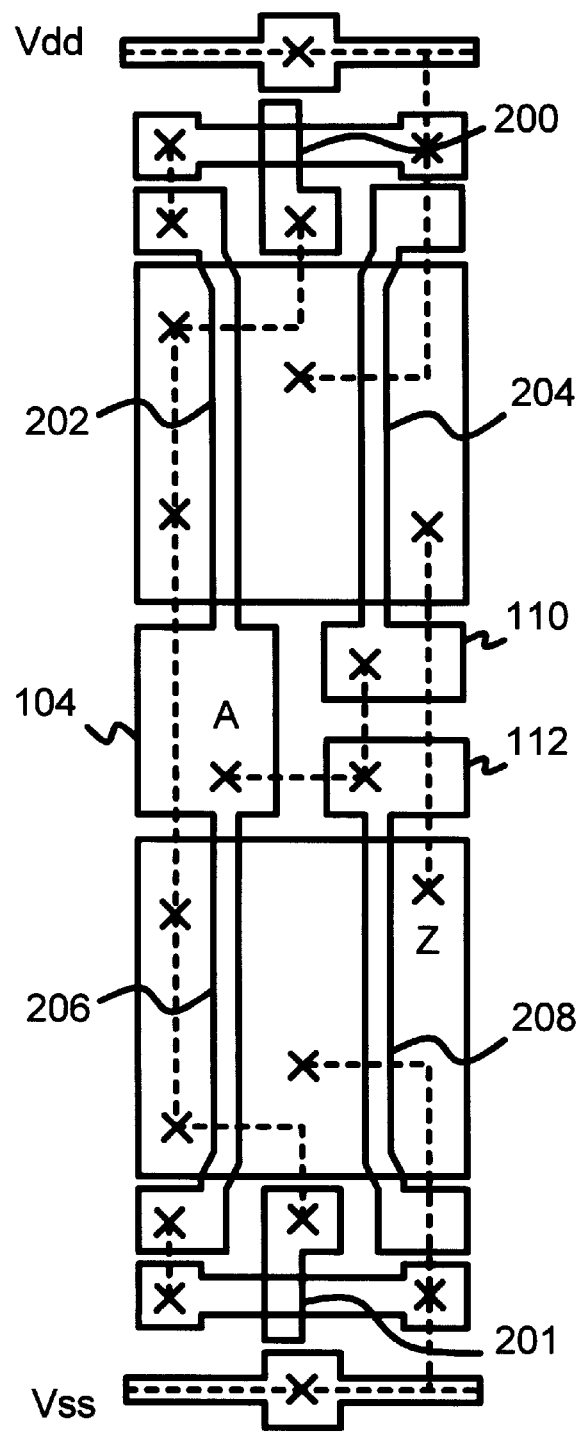

FIG. 9A is an inverting latch implemented in the gate-array cell shown in FIG. 9B. The A input of the inverting latch is connected to merged polysilicon line 104, which forms the gates of transistors 202, 206, which is inverter 212 in the feedback loop. The drains of transistors 202, 206 are connected to the gates of smaller transistors 200 201, forming feedback inverter 210. The drains of transistors 200, 201 are connected to input node A, using polysilicon line 104. Polysilicon line 104 is useful as local interconnect, avoiding another metal line in the cell, because the feedback delay is not critical.

Using smaller transistors 200, 201 for feedback inverter 210 ensures that the A input's driver (not shown) is not over-powered by the latch's feedback. Input A is also connected to polysilicon lines 110, 112, forming larger transistors 204, 208, which are output inverter 214. The drains of transistors 204, 208 are connected together as the buffered Z output.

Vdd is connected to the sources of p-channel transistors 200, 202, 204, while ground is connected to the sources of n-channel transistors 201, 206, 208. Note that the location of the source and drain nodes can change depending on the cell connection; for some connections the drain is on the left while for other connections the drain is on the right of the gate.

Figure 10A:
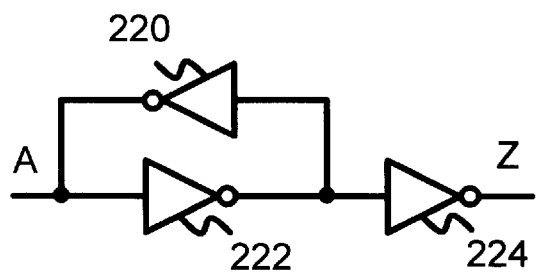
FIG. 10A is a non-inverting latch implemented in the gate-array cell shown in FIG. 10B.
Figure 10B:
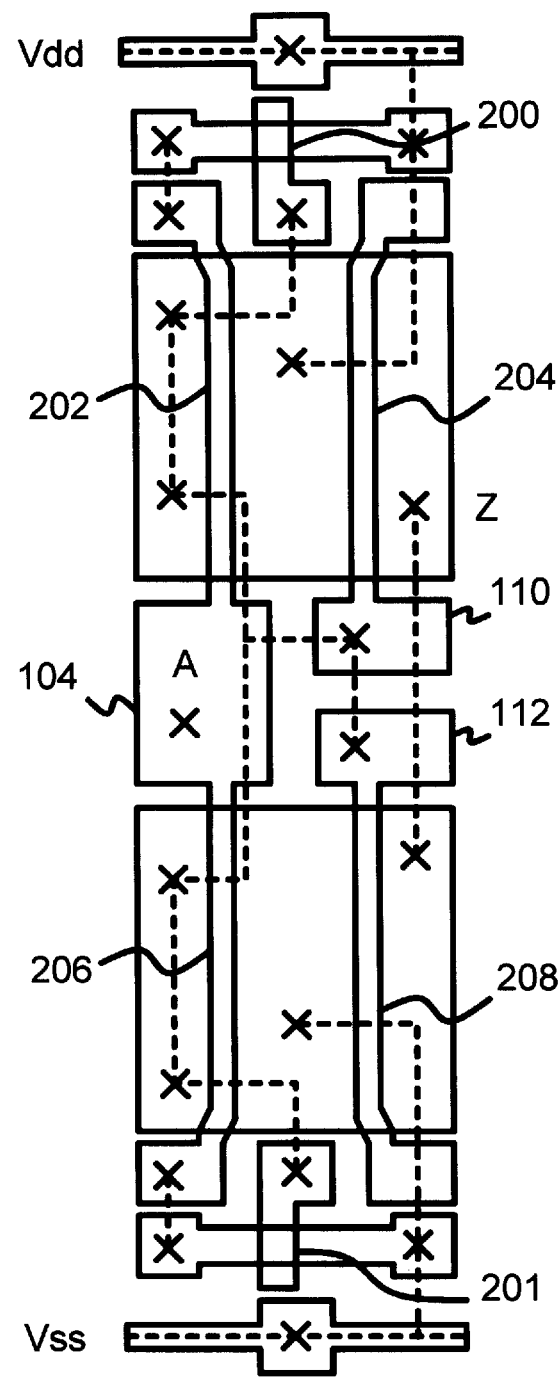

FIG. 10A is a non-inverting latch implemented in the gate-array cell shown in FIG. 10B. The A input of the non-inverting latch is connected to merged polysilicon line 104, which forms the gates of transistors 202, 206, which is inverter 222 in the feedback loop. The drains of transistors 202, 206 are connected together and to the gates of smaller transistors 200, 201. which form feedback inverter 220. The drains of transistors 200, 201 are connected to node A, using polysilicon line 104.

The drains of transistors 202, 206, the output of inverter 222, are also connected to polysilicon lines 110, 112, forming larger transistors 204, 208, which are output inverter 224. The drains of transistors 204, 208 are connected together as the buffered Z output. Vdd is connected to the sources of p-channel transistors 200, 202, 204, while ground is connected to the sources of n-channel transistors 201, 206, 208.

Figure 11A:
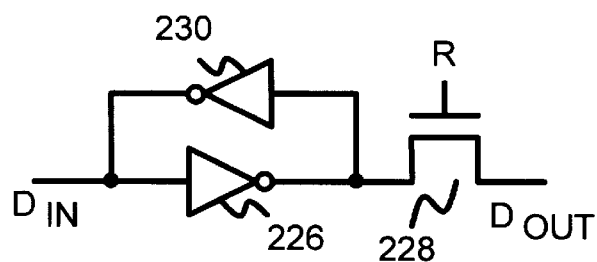
FIG. 11A is a memory cell implemented in the gate-array cell shown in FIG. 11B.
Figure 11B:
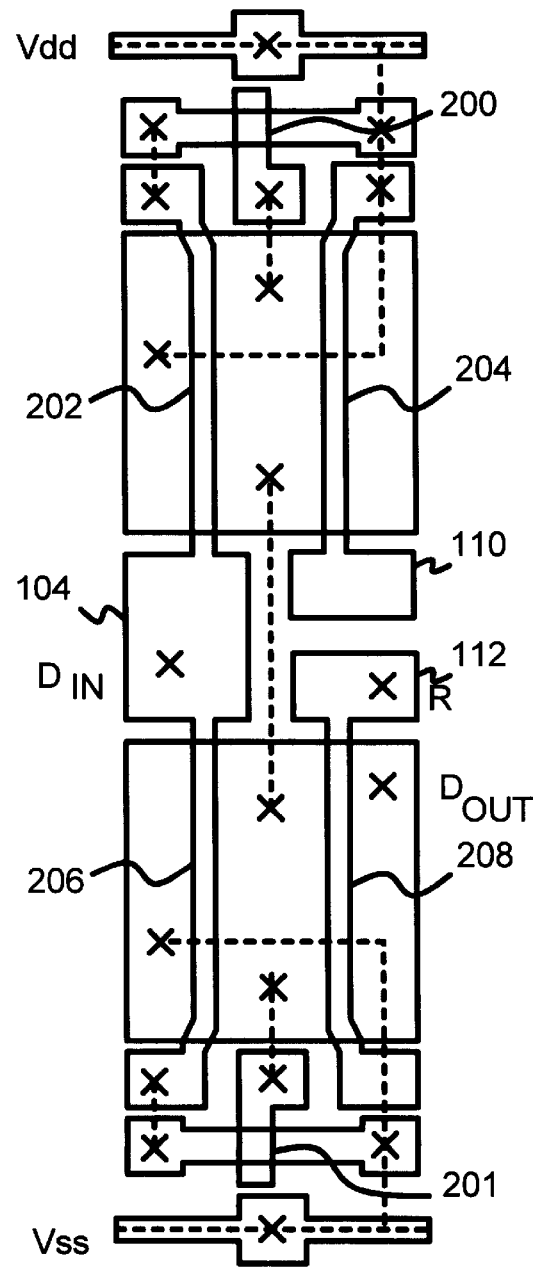

FIG. 11A is a memory cell implemented in the gate-array cell shown in FIG. 11B. The memory cell of FIGS. 11A, 11B is useful when arrayed with other cells as a shift register or FIFO. A two-phase clocking scheme can be used to shift data among cells.

The Din input of the memory cell is connected to merged polysilicon line 104, which forms the gates of transistors 202, 206, which is inverter 226 in the feedback loop. The drains of transistors 202, 206 are connected together and to the gates of smaller transistors 200, 201, which form feedback inverter 230. The drains of transistors 200, 201 are connected to node Din, using polysilicon line 104.

The drains of transistors 202, 206, the output of inverter 226, are also connected to the source of n-channel transistor 208, which is pass transistor 228 to output Dout. A full transmission gate rather than just an n-channel transistor 228 can be substituted by connecting polysilicon lines 110, 112 and connecting Dout also to the drain of p-channel transistor 204.

Vdd is connected to the source of p-channel transistors 200, 202, while ground is connected to the source of n-channel transistors 201, 206. The smaller transistors 200, 201 are used for feedback inverter 230.

D-FLIP-FLOP WITH CLEAR—FIG. 12

Figure 12:
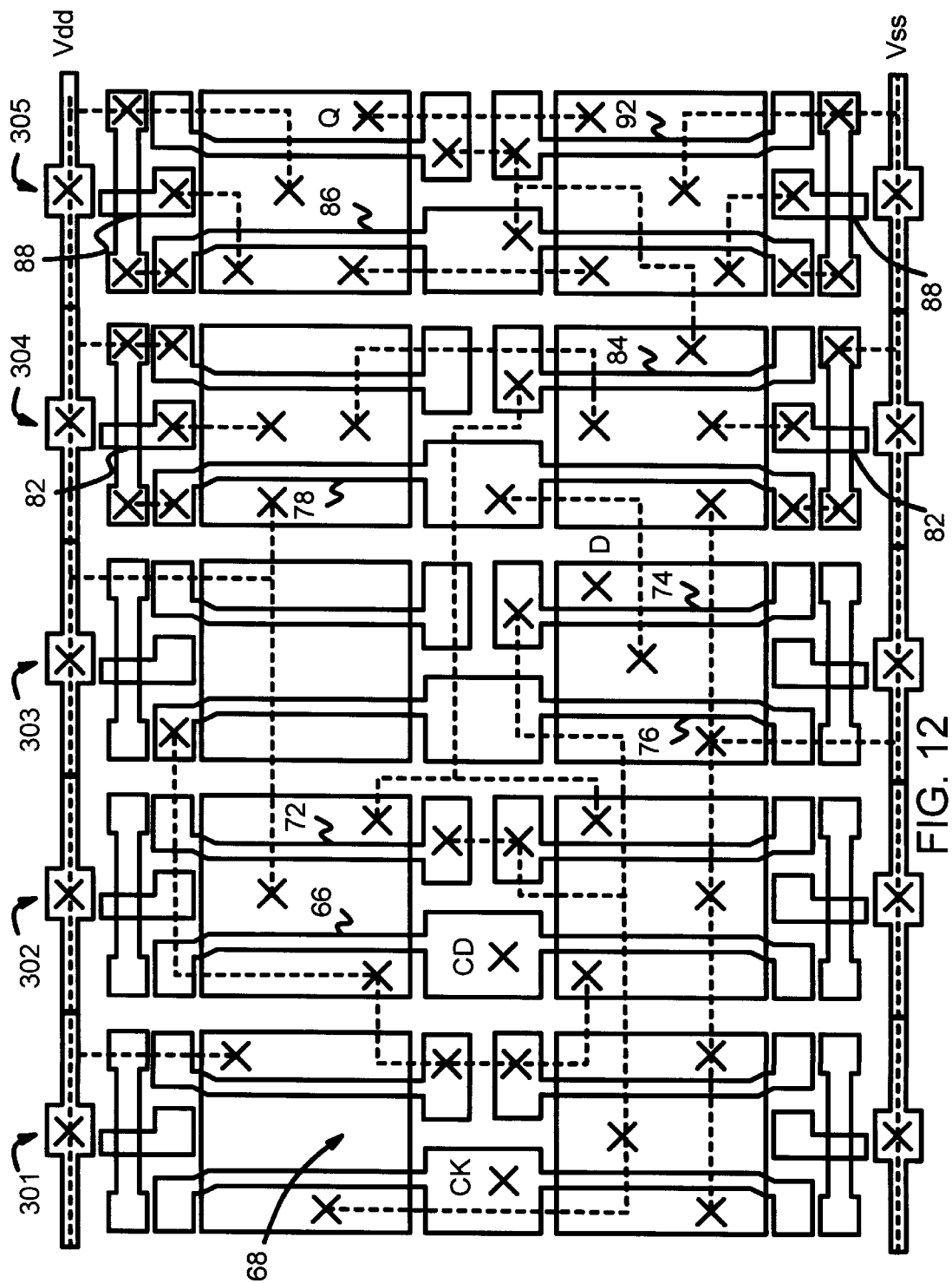
FIG. 12 is a layout diagram of the flip-flop with clear of FIG. 4.

FIG. 12 is a layout diagram of the flip-flop with clear of FIG. 4. FIG. 12 uses the same reference numbers for the gates and transistors of FIG. 4. Five gate-array cells 301–305 are used for the flip-flop with clear. The left-most cell 301 contains NOR gate 68, while the next cell 302 contains CD inverter 66 and clock inverter 72. The middle cell 303 contains n-channel pass transistor 74 and pull-down n-channel transistor 76. The first three gate-array cells 301–303 use only the larger transistors and not the smaller transistors.

Fourth cell 304, the second from the right, contains inverters 82, 78, which form the master latch feedback loop, and n-channel pass transistor 84 between the master and slave latches. The right-most cell, fifth cell 305, contains the slave latch and the output inverter 92. The slave latch is composed of full-sized inverter 86 and feedback inverter 88, made from the smaller transistors.

Other variations of the flip-flop of FIG. 12 can be implemented, such as a flip-flop with set rather than clear, or a flip-flop with both set and clear. A flip-flop without either set or clear requires one less gate-array cell, only four cells. A flip-flop with both set and clear requires one more cell, a total of six gate-array cells. Table 1 summarizes the number of gate-array cells required to implement various circuits with a prior-art cell and schematic and with the reduced-transistor schematic and the gate-array cell with larger and smaller transistors.

TABLE 1

Comparison of Cells Required

| | Cell w/Small & Large Transistors | Prior-Art Cell | % Reduction |
|---|---|---|---|
| D Flip-Flop | 4 | 6 | 33.33 |
| D Flip-Flop with Clear | 5 | 7 | 28.57 |
| D Flip-Flop with Set & Clear | 6 | 8 | 25 |
| Latch | 2 | 5 | 60 |
| Memory Cell | 1.5 | 3 | 50 |

ADVANTAGES OF THE INVENTION

The NAND gates for the set or clear functions are replaced by simple pull-up or pull-down transistors and clock control. The pull-down transistor pulls low the input of a cross-coupled inverter latch, writing a low to the master latch. The cleared master then writes the zero to the slave latch through an open pass transistor. The output is buffered by an inverter. Thus output loading does not affect the slave latch.

The flip-flop with clear of FIG. 4 requires only 21 transistors compared to 28 transistors for the prior-art of FIG. 1. This is a reduction of 25% of the number of transistors. Area is further reduced by using smaller-size transistors for the feedback inverters of the master and slave latches. Interconnection wiring is simplified second-layer metal is not needed. Wiring from p-channel transistors to n-channel transistors for transmission gates is not needed with the simple pass transistors. The clock-to-output delay is improved since slower NAND gates are replaced by inverters.

A wide variety of latches, flip-flops, and logic gates can be implemented with the gate-array cell with smaller and larger transistors. The cell is efficient since the smaller transistors are used for feedback inverters, where a large current drive is not necessary; indeed is undesirable. Using the smaller feedback transistors facilitates the elimination of the transmission gate in the feedback path, further reducing flip-flop area.

Providing the pair of smaller transistors in each gate-array cell may seem wasteful, but the small size of these transistors allows them to fit between the larger transistors' polysilicon contact tabs. The smaller transistors are formed in the interstitial area between the larger transistors so that the area of the cell is expanded only slightly, and only in height and not in width. Thus the additional area for the smaller transistors is minimal. In return, the smaller transistors increase the number of transistors in each cell by 50%, allowing more circuitry to be squeezed into fewer cells. The dramatic reductions in the number of gate-array cells required for the basic functions shown in Table 1 testifies to the usefulness of the cell with larger and smaller transistors.

The smaller transistors enable a reduction in the number of transistors required. The smaller transistors allow a feedback inverter to directly connect to the input, since the input can easily over-power the feedback current. This is not possible when only larger transistors are used. Transmission gates are eliminated when direct feedback is feasible. Thus, the smaller transistors enable a reduction in transistor count as well as being smaller in size.

ALTERNATE EMBODIMENTS

Several other embodiments are contemplated by the inventor. For example the smaller-size gates could have their transconductance reduced even further than possible by reducing the gate width W by increasing the gate length L above the minimum used for other gates. The gate-array cell can be arrayed in a chip with custom macro-blocks such as memory arrays or processor blocks. The gate-array cell may also be used in a smaller gate-array region of a larger custom chip, or as standard cells. The gate-array cell may be mirrored or flipped as needed rather than strictly arrayed without mirroring.

The cell layout can be modified or optimized somewhat, such as by rounding or cropping corners of active areas, polysilicon lines, and metal lines. The poysilicon gates can be merged or separate. The cell with larger and smaller transistors can be fit into an existing form factor of standard gate-array cells with only large transistors by shrinking the large transistors somewhat to make room for the smaller transistors.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A gate-array cell having large and small transistors, the gate-array cell comprising:

a large p-channel active area having a first large p-channel transistor and a second large p-channel transistor, the first large p-channel transistor formed where a first polysilicon line crosses the large p-channel active area, the second large p-channel transistor formed where a second polysilicon line crosses the large p-channel active area;

a small p-channel active area having a small p-channel transistor;

an N-well tap for providing a substrate bias to bulk terminals of the first and second large p-channel transistors and the small p-channel transistor;

a large n-channel active area having a first large n-channel transistor and a second large n-channel transistor, the first large n-channel transistor formed where a third polysilicon line crosses the large n-channel active area, the second large n-channel transistor formed where a fourth polysilicon line crosses the large n-channel active area;

a small n-channel active area having a small n-channel transistor;

a P-well tap for providing a substrate bias to bulk terminals of the first and second large n-channel transistors and the small n-channel transistor;

wherein the small p-channel transistor has a maximum current drive of less than one-quarter of a maximum current drive of the first large p-channel transistor, and wherein a maximum current drive of the first large p-channel transistor is substantially equivalent to maximum current drive of the second large p-channel transistor; and wherein the small n-channel transistor has a maximum current drive of less than one-quarter of a maximum current drive of the first large n-channel transistor, and wherein a maximum current drive of the first large n-channel transistor is substantially equivalent to maximum current drive of the second large n-channel transistor, whereby the gate-array cell contains four large and two small transistors.

2. The gate-array cell having large and small transistors of claim 1 wherein the gate-array cell is arrayed into multiple rows on a gate-array chip, and wherein metal layers and contacts between the metal layers and the first, second, third, and fourth polysilicon lines and the large and small p-channel and n-channel active areas are customized for different customer designs.

3. The gate-array cell having large and small transistors of claim 2 wherein the large p-channel transistors, the large n-channel transistors, the small p-channel transistor, and the small n-channel transistor have a same orientation wherein source and drain active areas are on right and left sides of each polysilicon gate of each transistor, whereby all transistors have the same orientation.

4. The gate-array cell having large and small transistors of claim 1 wherein the small p-channel transistor is between the N-well tap and the large p-channel active area and wherein the small n-channel transistor is between the P-well tap and the large n-channel active area.

5. The gate-array cell having large and small transistors of claim 4 wherein the small p-channel transistor is located midway between an upper end of the first large p-channel transistor, an upper end of the second large p-channel transistor, and the N-well tap, and wherein the small n-channel transistor is located midway between a lower end of the first large n-channel transistor, a lower end of the second large n-channel transistor, and the P-well tap, whereby the small p-channel and n-channel transistors are located between the large transistors and the well taps.

6. The gate-array cell having large and small transistors of claim 5 wherein the first polysilicon line and the third polysilicon line are connected together by polysilicon to form a merged polysilicon line, but wherein the second polysilicon line is separate from the fourth polysilicon line, whereby the merged polysilicon line connects to both the first large p-channel transistor and the first large n-channel transistor, without requiring metal for local connection.

7. The gate-array cell having large and small transistors of claim 5 wherein the gate-array cell contains exactly four large and exactly two small transistors, whereby each gate-array cell contains six transistors.

8. The gate-array cell having large and small transistors of claim 7 wherein the N-well tap is connected to a power supply voltage and wherein the P-well tap is connected to a ground voltage.

9. The gate-array cell having large and small transistors of claim 1 further comprising:

a feedback inverter formed from the small p-channel transistor and the small n-channel transistor by connecting together their gates and connecting together their drains;

a driver inverter formed from the first large p-channel transistor and the first large n-channel transistor by connecting together their drains and by connecting the first and third polysilicon lines together;

a latch formed from the feedback inverter and the driver inverter by connecting an input of the feedback inverter to an output of the driver inverter, and by connecting an output of the feedback inverter to an input of the driver inverter;

an input to the latch driven from outside the gate-array cell, the input to the latch being directly connected to the output of the feedback inverter and the input of the driver inverter;

whereby the feedback inverter using small transistors has less than one-fourth the maximum current drive of the driver inverter using large transistors, allowing the latch to be over-written from the input.

10. The gate-array cell having large and small transistors of claim 9 wherein the latch is coupled to a drain of the second large n-channel transistor, the fourth polysilicon line being a gate of the second large n-channel transistor coupled to a clock signal for clocking the latch, whereby a clocked latch is formed in the gate-array cell.

11. The gate-array cell having large and small transistors of claim 10 further comprising:

a second gate-array cell identical to the gate-array cell, the gate-array cell coupled to the second gate-array cell to form a flip-flop having a master latch in the gate-array cell and a slave latch in the second gate-array cell, whereby only two gate array cells are needed for a master latch and the slave latch of the flip-flop.

12. A gate-array cell layout comprising:

a large p-channel active area having a first large p-channel transistor and a second large p-channel transistor, the first large p-channel transistor formed where a first polysilicon line crosses the large p-channel active area, the second large p-channel transistor formed where a second polysilicon line crosses the large p-channel active area;

a small p-channel active area having a small p-channel transistor;

a large n-channel active area having a first large n-channel transistor and a second large n-channel transistor, the first large n-channel transistor formed where a third polysilicon line crosses the large n-channel active area, the second large n-channel transistor formed where a fourth polysilicon line crosses the large n-channel active area;

a small n-channel active area having a small n-channel transistor;

wherein the small p-channel transistor has a maximum current drive of less than one-quarter of a maximum current drive of the first large p-channel transistor, and wherein a maximum current drive of the first large p-channel transistor is substantially equivalent to maximum current drive of the second large p-channel transistor; and wherein the small n-channel transistor has a maximum current drive of less than one-quarter of a maximum current drive of the first large n-channel transistor, and wherein a maximum current drive of the first large n-channel transistor is substantially equivalent to maximum current drive of the second large n-channel transistor, whereby the gate-array cell contains four large and two small transistors.

13. The gate-array cell layout of claim 12 wherein the gate-array cell is arrayed into multiple rows on a gate-array chip, and wherein metal layers and contacts between the metal layers and the first, second, third, and fourth polysilicon lines and the large and small p-channel and n-channel active areas are customized for different customer designs.

14. The gate-array cell layout of claim 13 wherein the large p-channel transistors, the large n-channel transistor, the small p-channel transistors, and the small n-channel transistor have a same orientation wherein source and drain active areas are on right and left sides of each polysilicon gate of each transistor, whereby all transistors have the same orientation.

15. The gate-array cell layout of claim 12 further comprising:

an N-well tap for providing a substrate bias to bulk terminals of the first and second large p-channel transistors and the small p-channel transistor; and a P-well tap for providing a substrate bias to bulk terminals of the first and second large n-channel transistors and the small n-channel transistor;

wherein the small p-channel transistor is between the N-well tap and the large p-channel active area and wherein the small n-channel transistor is between the P-well tap and the large n-channel active area.

16. The gate-array cell layout of claim 15 wherein the small p-channel transistor is located midway between an upper end of the first large p-channel transistor, an upper end of the second large p-channel transistor, and the N-well tap, and wherein the small n-channel transistor is located midway between a lower end of the first large n-channel transistor, a lower end of the second large n-channel transistor, and the P-well tap, whereby the small p-channel and n-channel transistors are located between the large transistors and the well taps.

17. The gate-array cell layout of claim 16 wherein the first polysilicon line and the third polysilicon line are connected together by polysilicon to form a merged polysilicon line, but wherein the second polysilicon line is separate from the fourth polysilicon line, whereby the merged polysilicon line connects to both the first large p-channel transistor and the first large n-channel transistor, without requiring metal for local connection.

18. The gate-array cell layout of claim 16 wherein the gate-array cell contains exactly four large and exactly two small transistors, whereby each gate-array cell contains six transistors.

19. The gate-array cell layout of claim 18 wherein the N-well tap is connected to a power supply voltage and wherein the P-well tap is connected to a ground voltage.

20. The gate-array cell layout of claim 15 further comprising:

a feedback inverter formed from the small p-channel transistor and the small n-channel transistor by connecting together their gates and connecting together their drains;

a driver inverter formed from the first large p-channel transistor and the first large n-channel transistor by connecting together their drains and by connecting the first and third polysilicon lines together;

a latch formed from the feedback inverter and the driver inverter by connecting an input of the feedback inverter to an output of the driver inverter, and by connecting an output of the feedback inverter to an input of the driver inverter;

an input to the latch driven from outside the gate-array cell, the input to the latch being directly connected to the output of the feedback inverter and the input of the driver inverter;

whereby the feedback inverter using small transistors has less than one-fourth the maximum current drive of the driver inverter using large transistors, allowing the latch to be over-written from the input.

* * * * *